United States Patent [19]

Heckman, Jr.

[11] 4,091,337

[45] May 23, 1978

[54] COAXIAL CAVITY MICROWAVE OSCILLATOR WITH MANUALLY ADJUSTABLE CAPACITIVE FEEDBACK ELEMENT

[75] Inventor: LeRoy Francis Heckman, Jr., New Holland, Pa.

[73] Assignee: RCA Corporation, New York, N.Y.

[21] Appl. No.: 742,015

[22] Filed: Nov. 15, 1976

[51] Int. Cl.² .................................................. H03B 5/18
[52] U.S. Cl. .................................... 331/101; 331/177 R
[58] Field of Search ...................................... 331/96–98, 331/101, 102, 177 R

[56] References Cited

U.S. PATENT DOCUMENTS 2,779,873  1/1957  Tykulsky ............................. 331/98

Primary Examiner—Siegfried H. Grimm
Attorney, Agent, or Firm—Eugene M. Whitacre; Paul J. Rasmussen; Robert L. Troike

[57] ABSTRACT

An adjustable feedback in a pencil tube oscillator is provided by a pick-up element closely spaced from the center conductor of the output cavity of the oscillator with the pick-up element connected via a short length of rigid conductive wire to the cathode electrode in the input cavity. This pick-up element is a thin sheet of deformable conductive material fixed to the end of the rigid wire in a manner that permits the sheet to be easily bent toward or away from the center conductor to accommodate adjustment of the feedback coupling capacitance.

5 Claims, 4 Drawing Figures

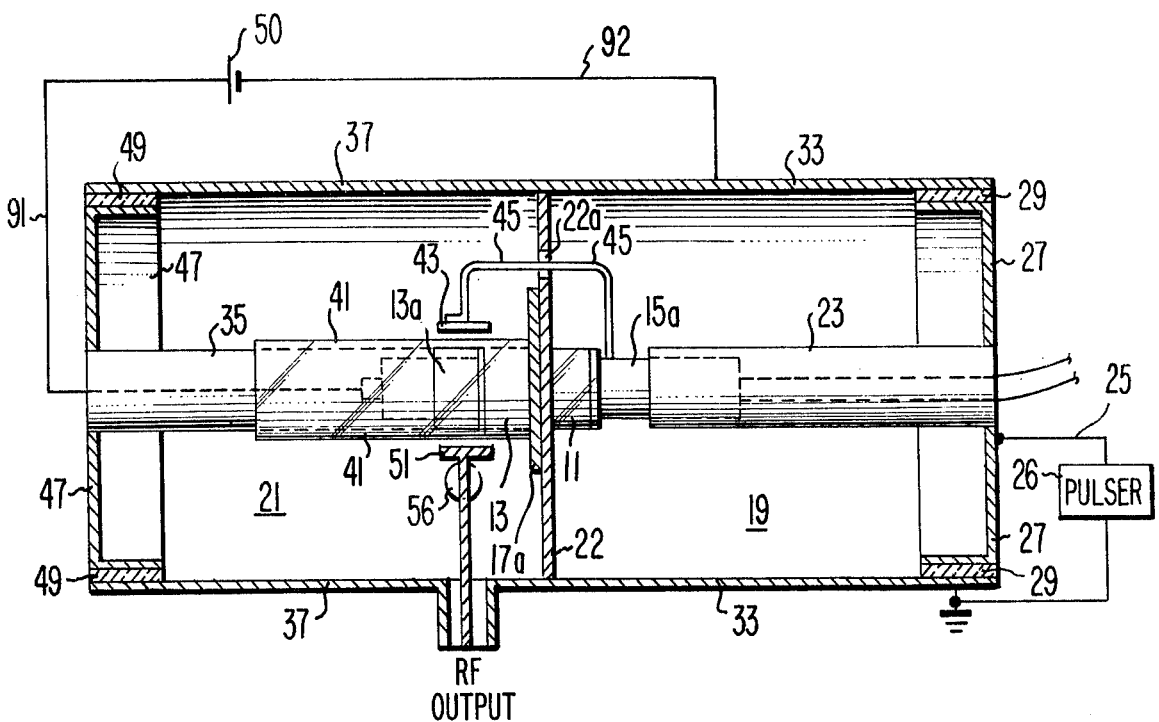
Fig.2
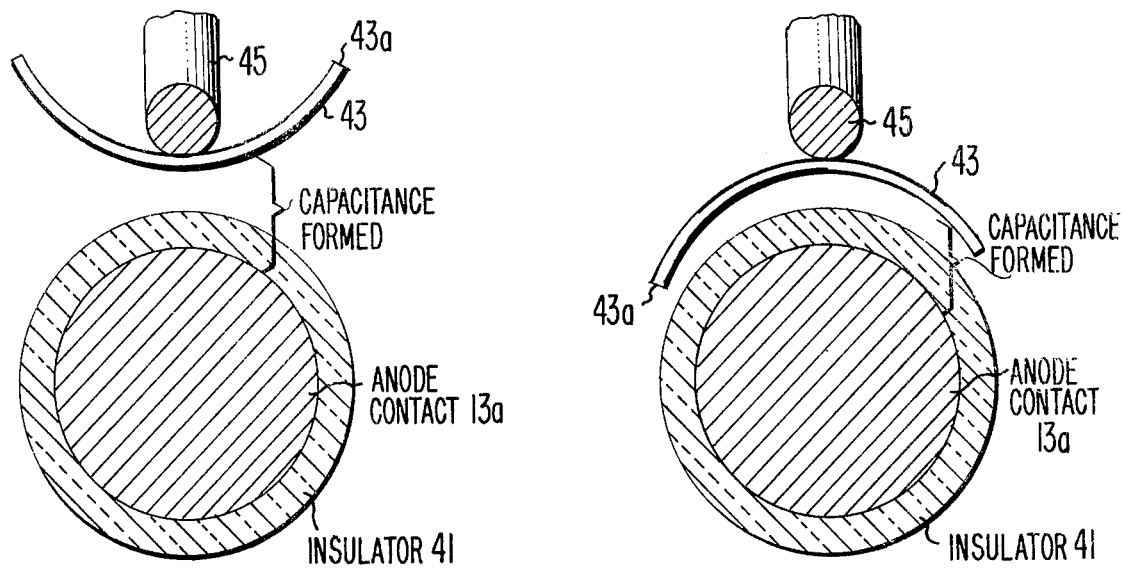
Fig.3
Fig.4

COAXIAL CAVITY MICROWAVE OSCILLATOR WITH MANUALLY ADJUSTABLE CAPACITIVE FEEDBACK ELEMENT

BACKGROUND OF THE INVENTION

This invention relates to high frequency oscillators using coaxial cavities and, more particularly, to such oscillators used in aircraft transponders.

In typical prior art pencil tube UHF oscillators, the feedback coupler consists of a wire probe coupled from the cathode line of the input cavity circuit through an aperture in the common wall to the output cavity circuit. This feedback technique does not give sufficient coupling to drive the tube to the tube's maximum RF capability. Another technique uses a rectangular strap probe in place of the wire probe with the widest part of the strap paralleling the center conductor of the output cavity over a sufficient length of the transmission line. This strap with sufficient length and with proper spacing from the center conductor provides enough feedback energy from the output cavity circuit to drive the tube to the maximum RF capability. This feedback circuit, however, must be rigid to withstand rigid vibration specifications. A typical vibration specification for such oscillators in aircraft transponders requires that they be subjected to vibration of constant total excursion of 0.10 inch from 5 to 55 Hz with a maximum acceleration of 1.5G and a constant acceleration of 1.0G from 55 to 2,000 Hz. Other vibrational tests will require the 55 to 2,000 Hz constant acceleration to a maximum of 10G's. The oscillator output frequency must stay within plus and minus 3 MHz of the center frequency and the power output must not drop below a minimum RF power output. Further, in a mass production environment, it is desirable to achieve an adjustment of the coupling circuit of at least 2 to 1 coupling ratio after the oscillator assembly has been completed. This adjustment corrects for operational tolerances such as tubes, circuits, etc. The rectangular strap pick-up is in the form of a cantilever beam structure and is subject to resonances that could fall within the forbidden vibration frequency band. By increasing the thickness of the strap to move the feedback structure resonant frequency up out of the band of interest also increases rigidity which decreases the ease of adjusting the feedback coupling.

SUMMARY OF THE INVENTION

An improved oscillator of the type using coaxial input and output cavities is provided wherein the feedback is achieved by a pick-up element connected to a rigid coupling member. The pick-up element is constructed of a thin sheet of deformable conductive material. The pick-up element is fixed to the rigid coupling member at one end such that the sheet is closely spaced from the center conductor of the output cavity and can be easily bent toward or away from the center conductor. The rigid coupling extends through an aperture in the wall separating the input and output cavities and is connected to the center conductor of the input cavity.

BRIEF DESCRIPTION OF THE DRAWINGS

FIG. 2 is a view of oscillator with a portion of the outer conductive shell removed for illustration, FIG. 3 is an end view of the feedback capacitor with minimum capacity setting, and FIG. 4 is an end view of the feedback capacitor with maximum capacity setting.

DESCRIPTION OF THE INVENTION

Figure 1:
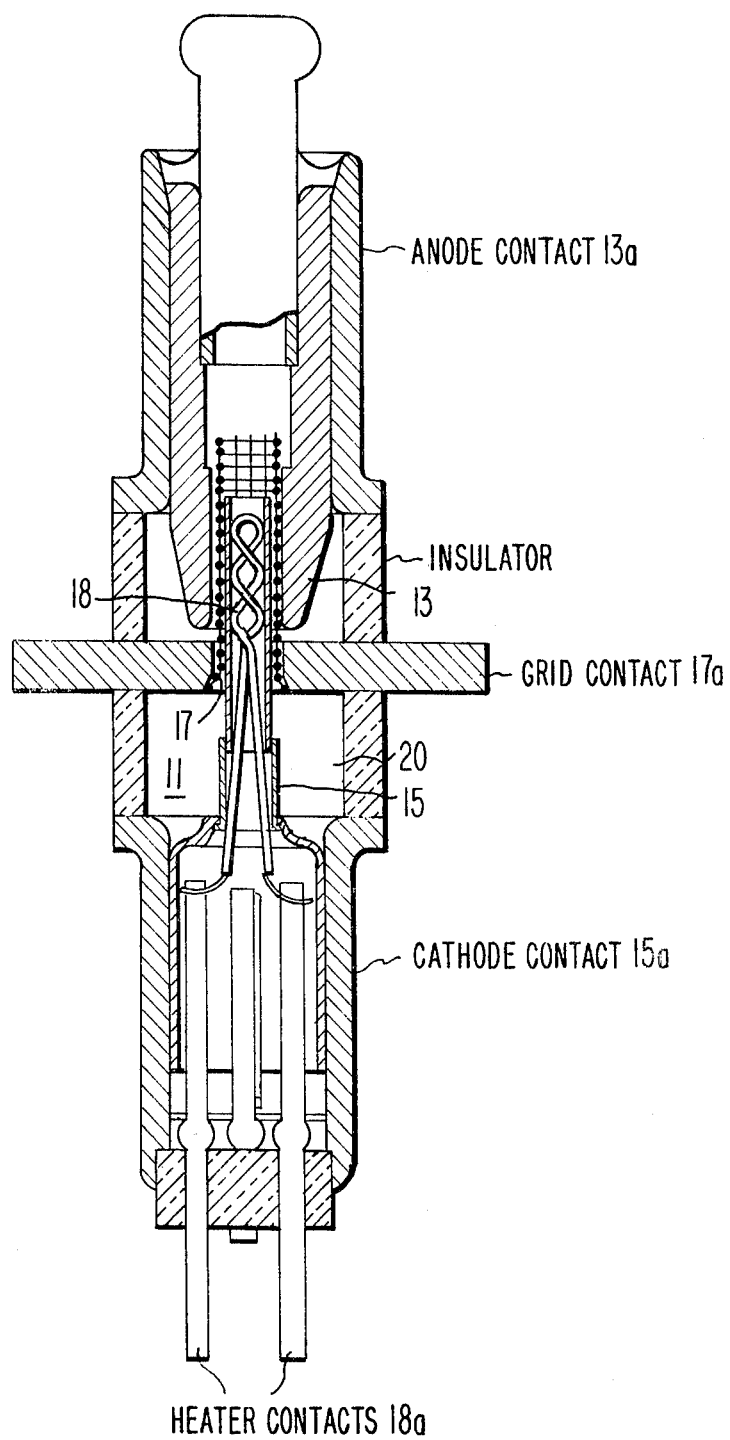
FIG. 1 is a cross-sectional view of a pencil tube.

Referring to FIG. 1, a cross-sectional view of a UHF pencil tube 11 is illustrated. This tube 11 includes an anode 13, a cathode 15 and a grid 17. The cathode 15 is connected to a cathode contact 15a which is a hollow cylindrical conductive member. The heater contacts 18a extend through the center of the cathode contact to the heater 18. The grid 17 is connected to a circular disk grid contact 17a which extends from the tube enclosure 20. The anode 13 is connected to an anode contact 13a which is a cylindrical conductive member.

Referring to FIG. 2, this oscillator tube 11 is positioned in a coaxial package that includes an input coaxial cavity resonator 19 and an output coaxial cavity resonator 21. The input coaxial cavity resonator 19 is separated by a common conductive wall 22 from the output coaxial cavity resonator 21. The grid contact 17a is connected to the conductive wall 22. (A portion of common wall 22 is removed for illustration purposes). The input coaxial cavity resonator 19 comprises an outer conductor 33 connected at one end to the conductive wall 22 and connected to a point at ground or reference potential. A hollow cylindrical center conductor 23 is coupled at one end to the cathode 15 (see FIG. 1) via the cathode contact 15a. The cylindrical center conductor 23 together with the cathode contact 15a form the center conductor of the input coaxial cavity resonator 19. The cylindrical conductor 23 is connected at the opposite end to flange 27. Flange 27 extends from the cylindrical conductor 23 toward the outer conductor 33 and forms an RF short circuit coaxial termination for the input cavity 19. This flange 27 is spaced by a body 29 of insulator material from the outer conductor 33 to form a DC blocker and RF bypass. The outer conductor 33 is spaced coaxially about the center conductor of the resonator 19. The inner diameter of the outer conductor 33 is dimensioned together with the outer diameter of the center conductor (made up of cathode contact 15a and conductor 23) and the length of the cavity resonator (length from wall 22 to flange 27) to form with the transmission line formed by grid-cathode structure of tube 11 a distributed transmission circuit a quarter wave resonant at a frequency below the desired output frequency. For tubes of this type, it has been found desirable that this input resonator be a quarter wave resonant at 850 MHz (for example) to achieve an efficient 1090 MHz oscillator.

The output coaxial resonator cavity 21 includes an outer conductor 37 connected to the wall 22 and outer conductor 33 to form a continuation of the grounded outer conductor 33. The center conductor for the output coaxial cavity resonator 21 is provided by a hollow cylindrical conductor 35 and the anode contact 13a with the anode contact 13a connected to conductor 35 near one end thereof. A flange 47 is connected to conductor 35 and extends from the conductor 35 toward the outer conductor 37. Flange 47 forms the RF short circuit coaxial termination for output cavity 21. This flange 47 is spaced by a body 49 of insulator material from the outer conductor 37 to form a DC blocker and RF bypass. The outer diameter of the center conductor (consisting of anode contact 13a and conductor 35) and the inner diameter of the outer conductor 37 are selected together with the length of the cavity resonator (length from wall 22 to a flange 47) to form with the transmission line formed by the anode-grid structure of tube 11 a one quarter wave resonant structure at the selected output frequency of for example 1090 MHz.

The desired RF output signal from the cavity 21 is coupled via a capacitive pick-up element 51 which extends thru the outer conductor 37 in the coaxial output cavity resonator 21. Additional frequency tuning of the output cavity may be provided by a shorted tuning stub 56 extending through the outer conductor 37. Both the coupling probe 51 and the tuning probe 56 are capacitively spaced from the anode contact 13a. The DC supply ($E_{bb}$) for the tube 11 is represented by a battery 50 with the positive terminal coupled via lead 91 to the anode contact 13a in the output cavity resonator 21. The minus terminal of the battery is coupled via lead 92 to the outer conductor 33 or to ground.

The oscillator is triggered into pulsed oscillations by a pulse modulator (pulser) 26 coupled between lead 25 connected to flange 27 and ground. This pulse modulator in response to a control signal grounds the cathode through a resistor causing pulsed oscillations in response to the control signals.

Feedback for the oscillator is provided by a capacitive pick-up element 43 welded, or fixed by other suitable conductive fastening arrangement, to one end of a support wire 45. This support wire 45, of suitable conductive material such as copper extends in an insulative manner through a small aperture 22a in the wall 22 that separates the input and output coaxial cavity resonators. Aperture 22a is made small enough so there remains isolation of the cavities. The wire 45 is similarly connected by welding or other suitable conductive fastening arrangement to the cathode contact 15a. The capacitive pick-up element 43 is a thin conductive sheet of for example one-half hard (OHFC) oxygen free high conductivity copper. The pick-up element 43 for example is 0.005 inch thick with 0.40 inch extending transverse to the lengthwise axis of the cavity resonator 21 and is 0.20 inch along the lengthwise axis of the cavity resonator. The pick-up element 43 is fixed to the wire 45 such that the sheet is easily bent toward or away from the anode contact 13a (center conductor of the output cavity resonator). When the pick-up element 43 is bent as shown in FIG. 3 so that the transverse ends 43a of the sheet are extending away from the anode contact 13a minimum capacity results. Maximum capacitive setting is achieved as illustrated in FIG. 4 wherein the ends 43a of the sheet are extended toward the anode contact 13a. This bending of the pick-up element to adjust the feedback coupling can be accomplished with the system assembled by removing the capacitive tuning probe 56 and extending a wire hook with a right angle bend on the end. The hook can be used to push the copper sheet toward or away from the anode contact 13a providing more or less capacitive coupling.

In the arrangement described above, the input cavity resonator 19 has a length of 1.35 inches and the output cavity resonator has a length of 1.5 inches. The center conductor in both cavities has an outside diameter of approximately 0.31 inch and the inside diameter of the outer conductor is 0.84 inch and the tube type is RCA A15621, made by RCA Corporation, Electro-Optics & Devices Solid State Div., Lancaster, Pa. The support wire 45 is of rigid #16 copper wire (0.051 inch diameter). The wire 45 extends vertically 0.2 inch high above the cathode contact 15a, then extends parallel with tube 11 center line a length 0.35 inch into output cavity and extends downward so the pick-up element 43 is about 0.05 inch from the anode contact 13a. A thin dielectric sleeve 41 extends about the anode contact and the center conductor to prevent contacting the anode contact with the coupling capacitor 51, frequency adjusting capacitor 56, and/or feedback pick-up element 43.

In a mass production environment, the rigid support wire 45 is adjusted with a tool such as long nose pliers or alike so as to position the pick-up element near the center conductor 35 and anode contact 13a. This operation can be viewed as a coarse adjustment of the feedback circuit. This operation is performed before the tube and associated transmission lines are sealed in the shell including the outer conductors 33 and 37. The pick-up element 43 is adjusted only after the oscillator has been operated at least once and a determination that the feedback circuit requires adjustment. This adjustment would be made by the procedure previously described by using the wire hook with the near right angle bend at the end.

The minimum practical transverse length—length extending transverse the lengthwise axis of the cavity—of the pick-up element 43 would be twice the diameter of the rigid conductive support 45. The maximum practical transverse length would be determined by the pick-up element 43 fundamental mode vibration characteristic frequency. The maximum longitudinal length of the pick-up element 43 along axis of the coaxial cavity would also be determined by the pick-up element fundamental mode vibration characteristic frequency.

What is claimed is:

1. In a microwave oscillator of the type including an active device in a coaxial package comprising an input coaxial RF resonator and an output coaxial RF resonator with a common conductive wall separating the input and the output resonators, said active device including an input, an output and a common electrode with the common electrode coupled to the common wall, the input electrode coupled to the center conductor of the input resonator and the output electrode coupled to the center conductor of the output resonator, the improvement therewith for providing adjustable feedback comprising:

a wire-like coupling member of rigid conductive material connected at one end to the center conductor of the input resonator and extending in insulative manner through said common wall to a point closely spaced from the center conductor of the output resonator, a sheet of conductive material fixed to the free end of said wire-like coupling member with said sheet closely spaced from the center conductor of said output resonator to provide capacitive coupling therewith, said sheet being thin and of a deformable material to permit the ends of said sheet to be easily bent toward and away from the center conductor of said output resonator to easily adjust the capacitive coupling provided by the sheet without disturbing the support provided by the wire-like coupling member.

2. The combination of claim 1 wherein said sheet has a length transverse the longitudinal axis of the cavity that is at least twice the diameter of the wire-like coupling member.

3. The combination of claim 1 wherein said sheet has a length transverse the longitudinal axis of the cavity that is greater than its length along the lengthwise axis of the cavity.

4. The combination of claim 3 wherein the ratios of said lengths is at least 2 to 1.

5. The combination of claim 1 wherein said sheet is of a thickness on the order of 1/10 the thickness of the diameter of the coupling member.

* * * * *